(12) United States Patent
Yu et al.

(10) Patent No.: US 7,468,305 B2
(45) Date of Patent: Dec. 23, 2008

(54) FORMING POCKET AND LDD REGIONS USING SEPARATE MASKS

(75) Inventors: Michael Yu, Taichung (TW); Chih-Ping Chao, Hsin-Chu (TW); Chih-Sheng Chang, Hsinchu (TW); Chun-Hong Chen, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 164 days.

(21) Appl. No.: 11/414,980

(22) Filed: May 1, 2006

(65) Prior Publication Data

US 2007/0254447 A1 Nov. 1, 2007

(51) Int. Cl.
*H01L 21/331* (2006.01)

(52) U.S. Cl. .................. 438/373; 438/372; 438/374; 438/305; 438/E21.205

(58) Field of Classification Search ......... 438/366–375, 438/301–306
See application file for complete search history.

(56) References Cited

U.S. PATENT DOCUMENTS

| 6,413,824 | B1 * | 7/2002 | Chatterjee et al. | ............ 438/275 |
| 2001/0025994 | A1 * | 10/2001 | Yoshino et al. | .............. 257/369 |
| 2007/0029608 | A1 * | 2/2007 | Huang | ......................... 257/327 |

* cited by examiner

*Primary Examiner*—Dung A. Le
(74) *Attorney, Agent, or Firm*—Slater & Matsil, L.L.P.

(57) ABSTRACT

A method of decoupling the formation of LDD and pocket regions is provided. The method includes providing a semiconductor chip including active regions, forming gate structures in the active regions, forming N-LDD regions on the semiconductor chip using an N-LDD mask, forming N-Pocket regions on the semiconductor chip using an N-Pocket mask, forming P-LDD regions on the semiconductor chip using a P-LDD mask, and forming P-Pocket regions on the semiconductor chip using a P-Pocket mask.

14 Claims, 8 Drawing Sheets

FORMING POCKET AND LDD REGIONS USING SEPARATE MASKS

TECHNICAL FIELD

This invention relates generally to metal-oxide-semiconductor (MOS) devices, and more particularly to the structure and fabrication method of integrated circuits having digital and analog MOS devices integrated on a same semiconductor chip.

BACKGROUND

Recent advances in bipolar/BiCMOS IC design and fabrication make possible the integration of digital and analog circuits on the same IC chip. This technology is widely used in mobile communication systems where a digital core is combined with analog RF circuits. The digital and analog circuits are typically formed as a variety of components.

To improve the performance of the CMOS devices, lightly doped drain/source (LDD) regions are formed. For digital CMOS devices, which are typically core devices, pocket regions are also formed in order to increase the junction abruptness. FIG. 1 illustrates a conventional NMOS digital device comprising LDD regions 2 and pocket regions 4. LDD regions 2 are of n-type, while pocket regions 4 are of p-type. Typically, LDD regions 2 are implanted using gate electrode 6 as a mask and are substantially aligned with edges of the gate electrode 6. Pocket regions 4 are typically slant implanted in order to extend under the gate electrode 6. Source/drain regions 8 are formed using spacers 10 as masks. PMOS devices have similar structures, and are formed using similar methods with respective impurity types reversed.

In the above-discussed processes, two masks, a first mask and a second mask, are required. The first mask is for masking NMOS devices when LDD and pocket regions of PMOS devices are formed. The second mask is for masking PMOS devices when respective LDD and pocket regions of NMOS devices are formed. Since each mask is used for the formation of both LDD and pocket regions, the formation of LDD regions and pocket regions are coupled.

The masks for the formation of digital CMOS devices, however, are not suitable for the formation of analog devices, which are typically used in I/O circuits. As opposed to digital CMOS devices that have only an "on" and an "off" state, analog CMOS devices have to operate between the two states and are more sensitive to impurity distribution. It has been found that analog CMOS devices are particularly sensitive to pocket doping. The formation of the pocket regions significantly lowers the intrinsic gain of the analog CMOS devices. Additionally, the threshold voltage of the analog CMOS devices becomes hard to control, thus making device matching more difficult when pocket regions are formed. This creates problems for the design of certain analog circuits, such as differential amplifiers. Therefore, it is preferred that analog devices not have pocket regions.

As the LDD regions and pocket regions of CMOS devices are coupled, if the same masks are used for the formation of pocket regions of digital devices, pocket regions will also be formed simultaneously for analog devices. As a solution, the first and the second masks are modified to be used for the formation of digital MOS devices only, with analog device regions masked. Two more masks, a third and a fourth mask, are added, wherein the third mask is for the formation of LDD regions of analog PMOS devices, and the fourth mask is for the formation of LDD regions of analog NMOS devices. The third and the fourth masks mask the digital CMOS regions.

Using the first, the second, the third and the fourth masks, each of the digital devices may have both LDD regions and pocket regions, while each of the analog devices only have LDD regions. However, the conventional four-mask scheme is not flexible, making further improvement of the device performance difficult. Additionally, the intrinsic gains of the analog MOS devices, which are important factors for the performance of analog devices, cannot be tuned. Therefore, more flexible LDD and pocket formation schemes are needed.

SUMMARY OF THE INVENTION

The preferred embodiment of the present invention provides a method for decoupling the formation of LDD and pocket regions in integrated circuit design.

In accordance with one aspect of the present invention, the method includes providing a semiconductor chip comprising active regions, forming gate structures in the active regions, forming N-LDD regions on the semiconductor chip using an N-LDD mask, forming N-Pocket regions on the semiconductor chip using an N-Pocket mask, forming P-LDD regions on the semiconductor chip using a P-LDD mask, and forming P-Pocket regions on the semiconductor chip using a P-Pocket mask.

In accordance with another aspect of the present invention, a mask set for forming integrated circuits having digital MOS devices and analog MOS devices includes an N-LDD mask, an N-Pocket mask, a P-LDD mask and a P-Pocket mask. The N-LDD mask is adapted to form a first photo resist on a semiconductor chip, wherein the first photo resist exposes active regions of digital NMOS devices and select analog NMOS devices, and masks active regions of analog PMOS devices and digital PMOS devices. The P-LDD mask is adapted to form a second photo resist on the semiconductor chip, wherein the second photo resist exposes active regions of digital PMOS devices and select analog PMOS devices, and masks active regions of analog NMOS devices and digital NMOS devices. The N-Pocket mask is adapted to form a third photo resist on the semiconductor chip, wherein the third photo resist exposes active regions of digital NMOS devices and select analog PMOS devices, and masks active regions of analog NMOS devices and digital PMOS devices. The P-Pocket mask is adapted to form a fourth photo resist on the semiconductor chip, wherein the fourth photo resist exposes active regions of digital PMOS devices and select analog NMOS devices, and masks active regions of analog PMOS devices and digital NMOS devices.

The preferred embodiments of the present invention decouple the formation of LDD regions and pocket regions, making customizations of MOS devices possible without the need for extra masks.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
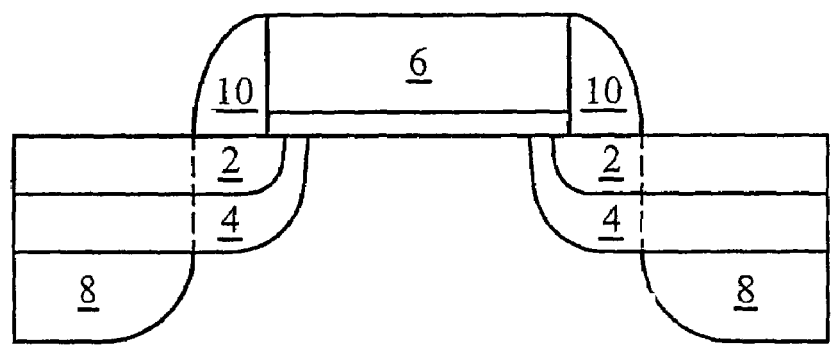
FIG. 1 illustrates a conventional NMOS device.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel scheme for the formation of LDD regions and pocket regions for CMOS devices are provided. Unless specifically pointed out, the illustrated MOS devices are analog devices. For simplicity purposes, only the formation of LDD regions and pocket regions are shown. One skilled in the art will realize the formation of source/drain regions and other regions necessary for MOS devices. Each figure includes two devices, an NMOS device, and a PMOS device.

In the preferred embodiment of the present invention, four masks will be used. A first mask (referred to as "N-LDD mask" throughout the description) is for the formation of n-type LDD regions. The N-LDD mask (hence photo resists formed using the N-LDD mask) masks the PMOS devices (including digital and analog PMOS devices). The N-LDD mask leaves the digital NMOS devices unmasked (so that the NMOS LDD regions will be formed) unless design requirements specifically demand that no LDD regions be formed. A preferred N-LDD mask may selectively mask active regions of the analog NMOS devices, so that the formation of analog NMOS devices may be customized.

The preferred embodiment of the present invention also provides a second mask (referred to as "P-LDD mask" throughout the description) for the formation of p-type LDD regions, a third mask (referred to as "N-Pocket mask" throughout the description) for the formation of p-type pocket regions, and a fourth mask (referred to as "P-Pocket mask" throughout the description) for the formation of n-type pocket regions. A summary of the functions of the masks is shown in Table 1, which indicates whether a device region is masked by a photo resist and formed using a mask.

TABLE 1

|  | N-LDD Mask | P-LDD Mask | N-Pocket (p-type) Mask | P-Pocket (n-type) Mask |
|---|---|---|---|---|
| Digital PMOS active region | Masked | Unmasked | Masked | Unmasked |
| Digital NMOS active region | Unmasked | Masked | Unmasked | Masked |
| Analog PMOS active region | Selective | Selective | Selective | Selective |
| Analog NMOS active region | Selective | Selective | Selective | Selective |

"Unmasked" indicates that a photo resist formed using the respective mask will leave the respective device region (column 1) unmasked for implanting, and the respective LDD or pocket region will be formed. "Masked" indicates that a photo resist formed using the respective mask will cover the respective device region (column 1), and the respective LDD or pocket region will not be formed. "Selective" indicates that the formation of the respective region can be customized, depending on design requirements.

By using a mask set including the above-discussed four masks, none of the LDD masks are used for the formation of pocket regions, and none of the pocket masks are used for the formation of LDD regions, thus the formations of LDD regions and pocket regions are decoupled.

Please note Table 1 only gives one of the preferred schemes. In the preferred embodiments of the present invention, since the formation of LDD regions and pocket regions are decoupled, other schemes can also be used. For example, if there are special requirements requiring no pocket formation for digital PMOS devices, the active regions of digital PMOS regions can be masked in the P-Pocket mask. No additional mask is required to satisfy such a requirement.

Using the masking scheme shown in Table 1, four preferred symmetric MOS structures, in which source and drain regions have the same structures, and six asymmetric structures can be formed. Most of the structures shown in FIGS. 2 through 15 are preferred for analog devices only. However, it is appreciated that by using the preferred embodiments of the present invention, all structures shown in FIGS. 2 through 15 can be formed for both analog devices and digital devices.

Figure 2:
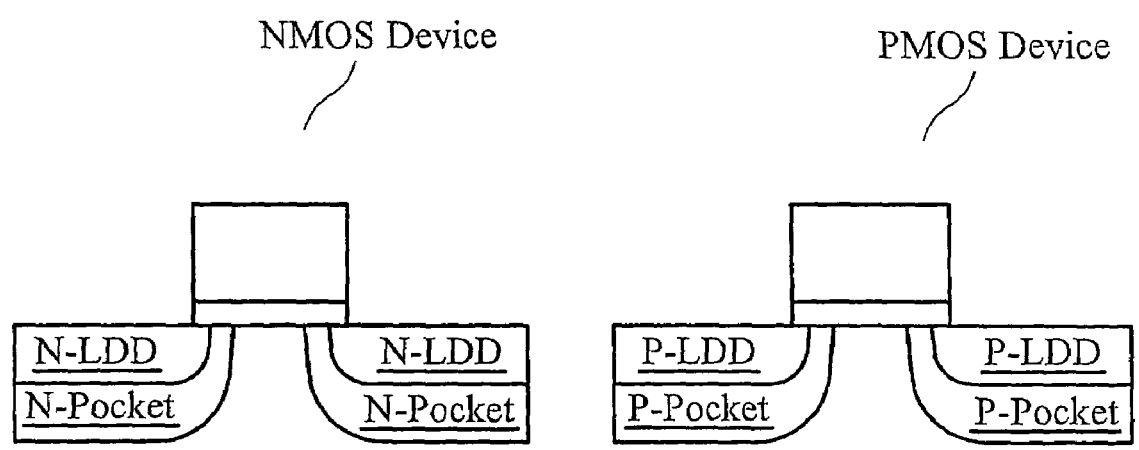
FIGS. 2 through 5 are symmetric MOS devices formed using the preferred embodiment of the present invention.

FIGS. 2 through 5 illustrate preferred structures of symmetric MOS devices. Referring to FIG. 2, an NMOS device includes N-LDD regions and N-Pocket regions, wherein N-LDD regions are of n-type and N-Pocket regions are of p-type throughout the description. In the preferred embodiment, the NMOS device and PMOS device shown in FIG. 2 are preferably digital MOS devices. To form such a structure, active regions of the shown NMOS devices are unmasked in the N-LDD mask and N-Pocket mask while masked in the P-LDD mask and P-Pocket mask. Conversely, the PMOS device includes P-LDD regions and P-Pocket regions, wherein P-LDD regions are of p-type and P-Pocket regions are of n-type throughout the description. To form such a structure, active regions of digital PMOS devices are unmasked in the P-LDD mask and P-Pocket mask and masked in the N-LDD mask and N-Pocket mask.

Figure 3:
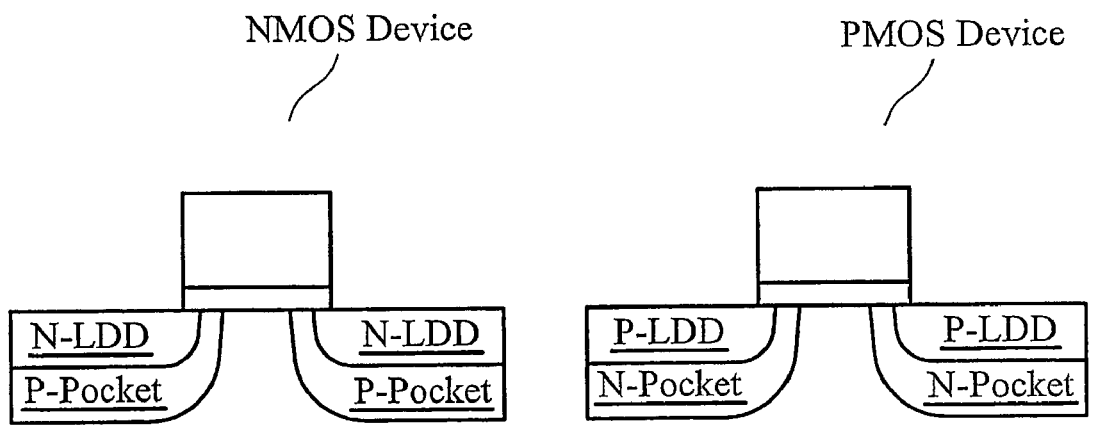

In FIG. 3, the NMOS device has N-LDD regions and P-Pocket regions. The PMOS device has P-LDD regions and N-Pocket regions. Since LDD regions and pocket regions of the same MOS devices are of the same type, structures shown in FIG. 3 are preferably used on analog devices. This structure can be formed by unmasking active regions of analog NMOS devices in the N-LDD mask and P-Pocket mask, and unmasking active regions of analog PMOS devices in the P-LDD mask and N-Pocket mask.

Figure 4:
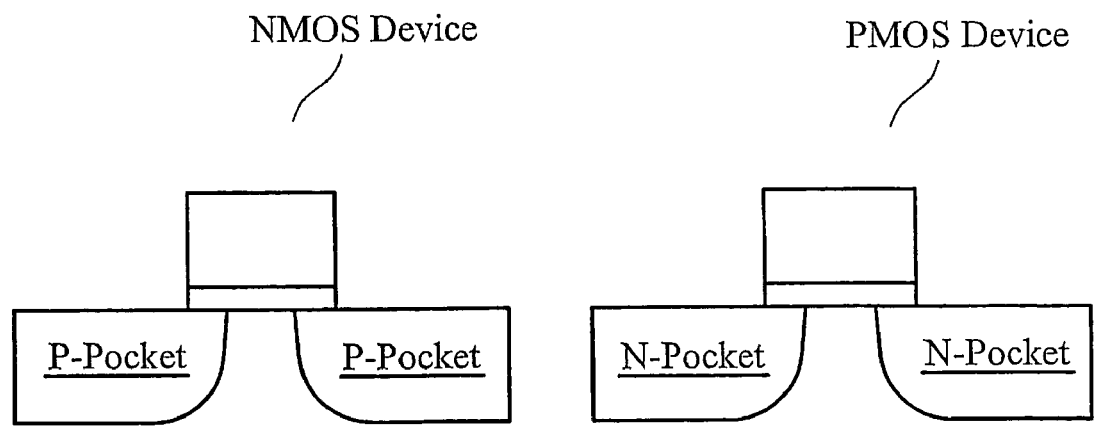

In FIG. 4, the NMOS device and PMOS device each have only pocket regions formed. To form the structure, active regions of analog NMOS devices are unmasked in the P-Pocket mask and masked in the P-LDD mask, N-LDD mask and N-Pocket mask. Similarly, active regions of PMOS devices are unmasked in the N-Pocket mask and masked in the N-LDD mask, P-LDD mask and P-Pocket mask.

Figure 5:
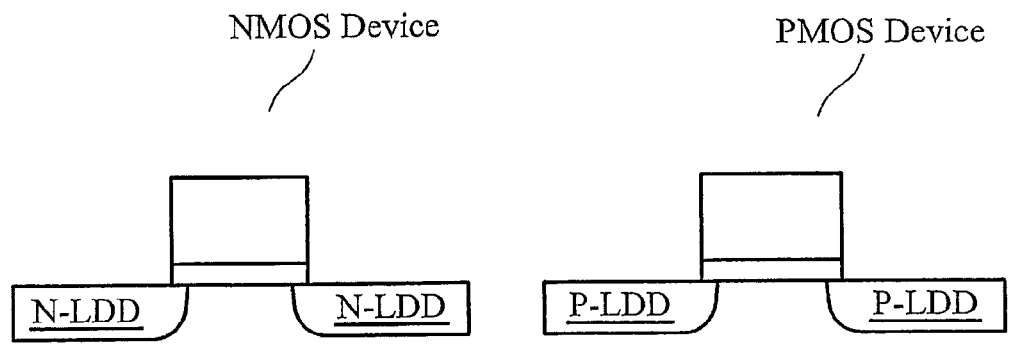

In FIG. 5, the NMOS device and PMOS device each have only LDD regions formed. To form the structure, active regions of analog NMOS devices are unmasked in the N-LDD mask and masked in the P-LDD mask, N-Pocket mask and P-Pocket mask. Conversely, active regions of PMOS devices are unmasked in the P-LDD mask and masked in the P-LDD mask, N-Pocket mask and P-Pocket mask.

As can be found from the above discussions, MOS devices having different combinations of LDD regions and pocket regions are made possible by the mask scheme provided in the preferred embodiment of the present invention. With different combinations, more customized requirements can be satisfied with no requirement for additional masks. For example, if the application demands analog MOS devices with low impedance in source/drain regions, structures in FIG. 3 can be adopted. Since both LDD regions and pocket regions, which are of the same type, are formed, sheet resistances in source and drain regions are reduced. In this case, LDD regions combined with pocket regions are equivalent to deeper LDD regions. MOS devices shown in FIG. 5, on the other hand, have LDD regions only. Since LDD regions have shallow and abrupt junctions, the MOS devices shown in FIG. 5 can satisfy the requirements for reduced short channel effects.

When structures shown in FIGS. 2 through 5 are formed, the entire active region for the device, including regions covered by the gate electrode and source/drain regions, is masked or unmasked. Further customization can be made so that source side LDD/pocket regions and drain side LDD/pocket regions are selectively unmasked or masked. The resulting MOS devices have asymmetric source and drain regions, as illustrated in FIGS. 6 through 11. For each MOS device illustrated in FIGS. 6 through 11, the left side of the gate electrode represents source side, while the right side of the gate electrode represents drain side.

To form asymmetric MOS structures, the four masks in the preferred mask set must have asymmetric patterns with respect to the source and drain regions of the MOS devices. LDD regions and pocket regions may be formed on either the source side or the drain side of the MOS device. Accordingly, the respective LDD masks and/or pocket masks have to mask only one half of the active region of the MOS device. The masked half and the unmasked half are preferably divided substantially close to the center of the gate electrode. The overlap region between the masked half and the gate electrode has to be long enough to allow mask alignment errors. To form asymmetric structures, the length of the gate electrode is preferably long, so that the source and/or drain regions can be masked with acceptable accuracy.

Figure 6:
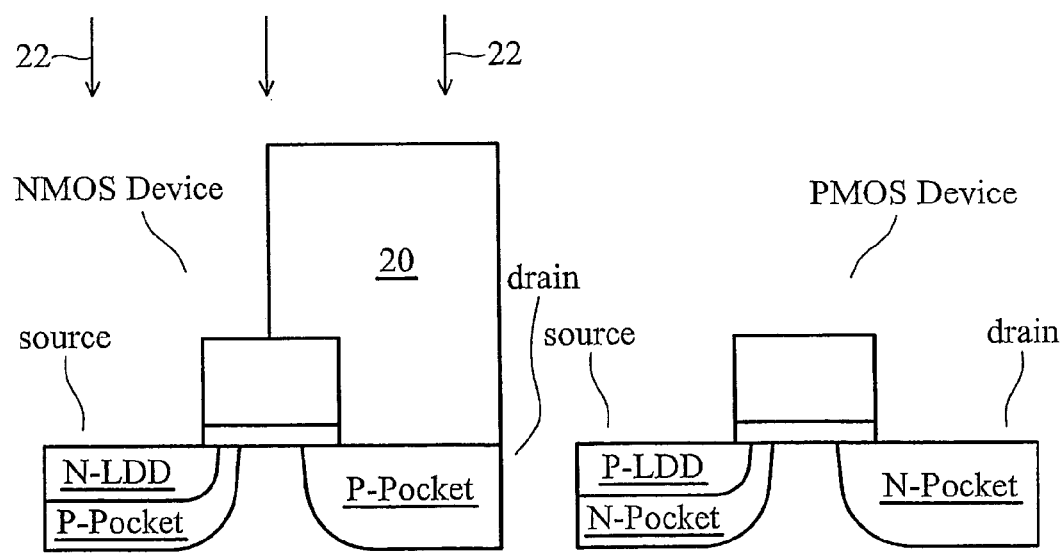
FIGS. 6 through 11 are asymmetric MOS devices formed using the preferred embodiment of the present invention.
Figure 7:
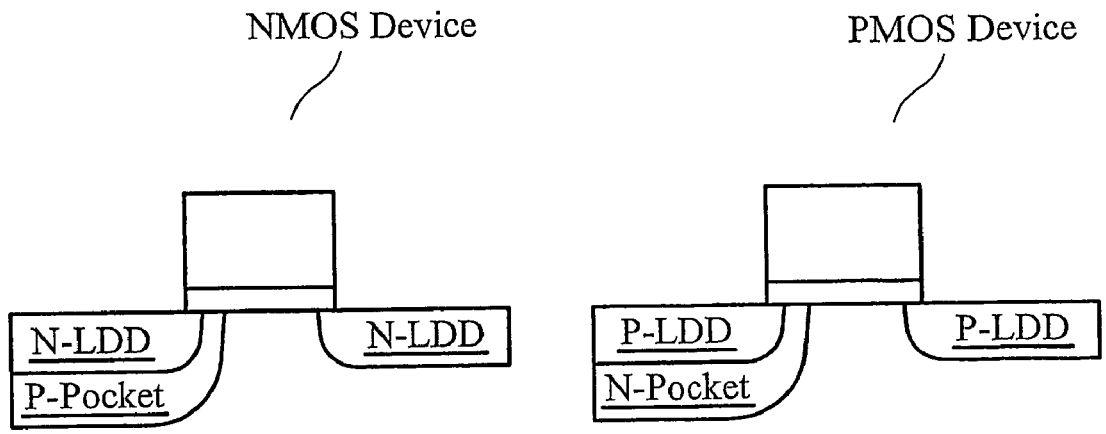
Figure 8:
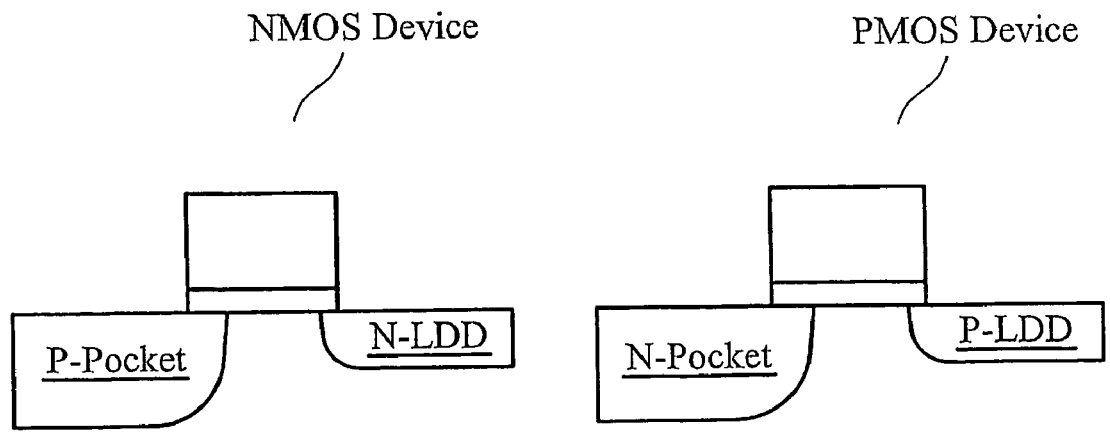
Figure 9:
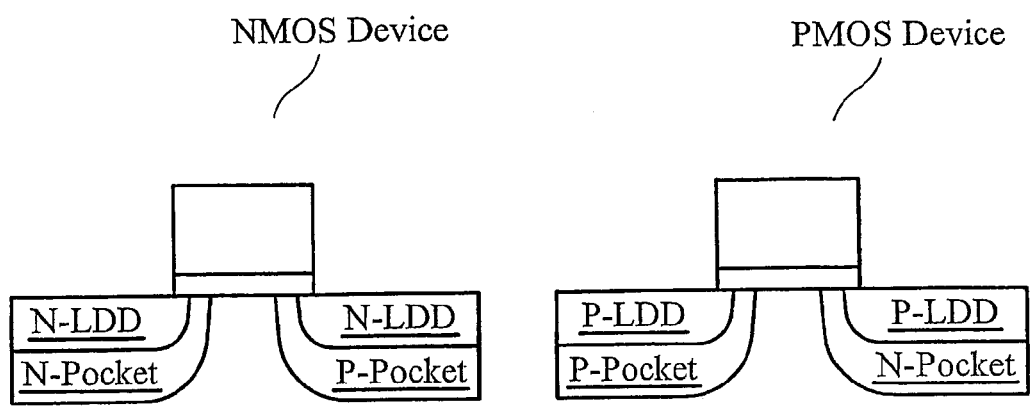
Figure 10:
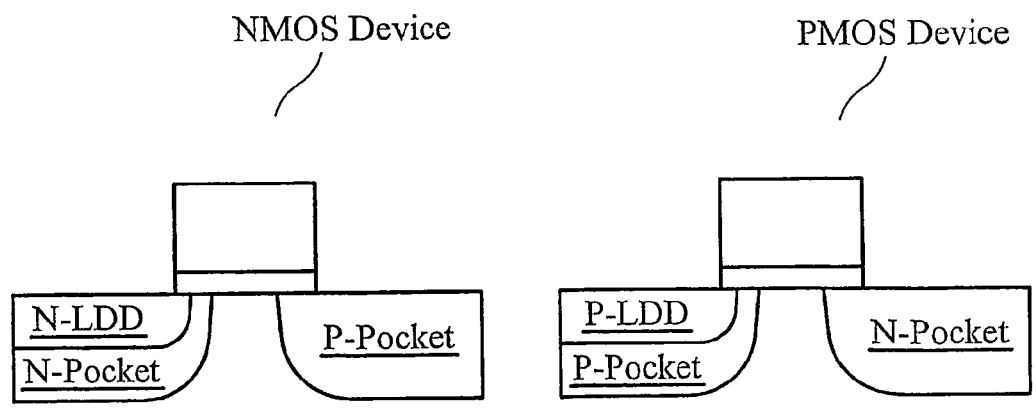
Figure 11:
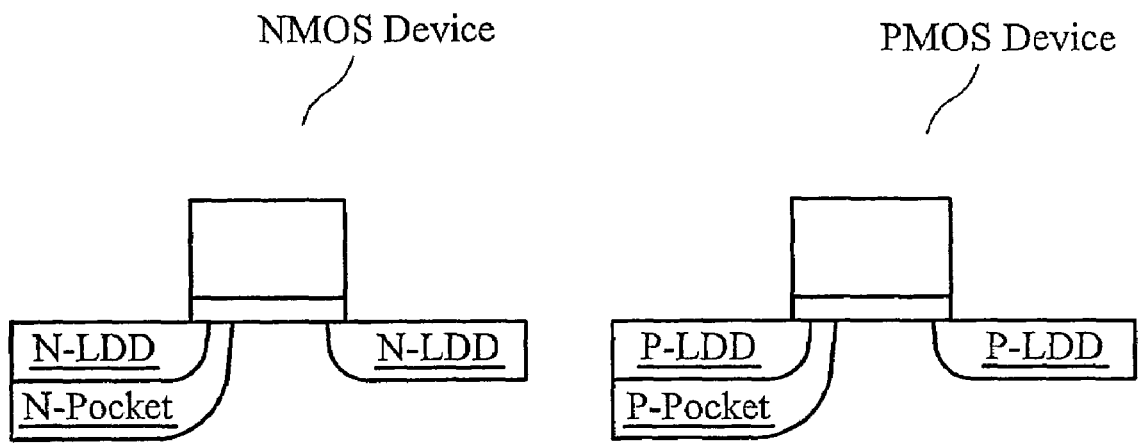

The formation of asymmetric structures is explained using FIG. 6. Each of the illustrated NMOS and PMOS devices includes a LDD region and a pocket region on the source side, and a pocket region on the drain side. To form such a structure, the source side of the active region of the NMOS device is unmasked in the N-LDD mask, the source side of the active region of the PMOS device is unmasked in the P-LDD mask, and drain sides of both devices are masked in both masks. Using the N-LDD mask, a photo resist 20 is formed, wherein the source side of the NMOS device is not covered. An implanting, as symbolized by arrows 22, will form a source LDD region only. Since pocket regions are formed on both sides of the NMOS device, a photo resist (not shown) formed using the P-Pocket mask, however, will have the entire NMOS device unmasked for implanting, and an n-type impurity will be implanted.

By using different combinations of LDD regions and pocket regions, MOS devices shown in FIGS. 7 through 11 can also be formed. Please note that each of the MOS devices shown in FIGS. 6 through 8 comprise only one type of impurities, while each of the MOS devices shown in FIGS. 9 through 11 comprise two types of impurities on the source side and one type of impurity on the drain side. One skilled in the art will realize the appropriate masks for the formation of these MOS devices, and the details are not discussed herein. It is appreciated that MOS structures shown in FIGS. 6 through 11 are only preferred structures, and other asymmetric structures can be formed using the mask set provided by the preferred embodiment of the present invention.

By customizing the formation of the source region and the drain region of the analog MOS devices, as shown in FIGS. 6 through 11, the performance can be further improved. For example, it is known that a source region having a low sheet resistance and a drain region having less diffusion under the gate electrode are desirable for high performance devices, and such requirements can be satisfied by forming the MOS devices shown in FIG. 7. On the source side, both LDD regions and pocket regions are formed, increasing the impurity concentration, thus resulting in low impedance, while on the drain side, only LDD regions are formed, and the MOS devices have less diffusion under the respective gate electrodes.

The decoupling of LDD regions and pocket regions makes possible further fine-tuning of electrical characteristics of CMOS devices. Exemplary embodiments are shown in FIGS. 12 through 15. MOS devices shown in FIGS. 12 through 15 include offset spacers 36, which are preferably formed on the sidewalls of gate electrodes before the formation of gate spacers. The formation procedure can be explained using the NMOS device shown in FIG. 12 as an example. After the patterning of a gate electrode 30, an N-Pocket mask (not shown) is used to form a first photo resist (not shown), wherein the active region of the NMOS device is exposed through the first photo resist. Pocket regions 32 are implanted using the gate electrode 30 as a mask. The first photo resist is then removed. Offset spacers 36 are formed subsequently. A second photo resist (not shown) is formed using an N-LDD mask and the active region of the NMOS device is exposed through the second photo resist. LDD regions 34 are then formed using the gate electrode 30 and the offset spacers 36 as masks. Due to the masking of the offset spacers 36, the LDD regions 34 are spaced further from the respective channel region. Electrical performance, therefore, is improved.

Figure 12:
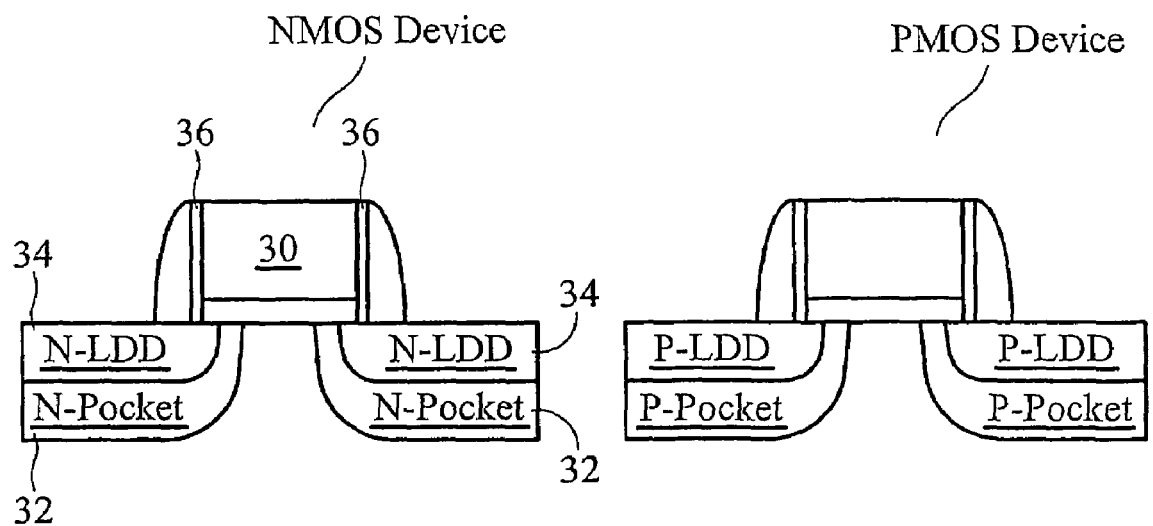
FIGS. 12 through 15 are MOS devices having offset spacers formed using the preferred embodiment of the present invention.
Figure 13:
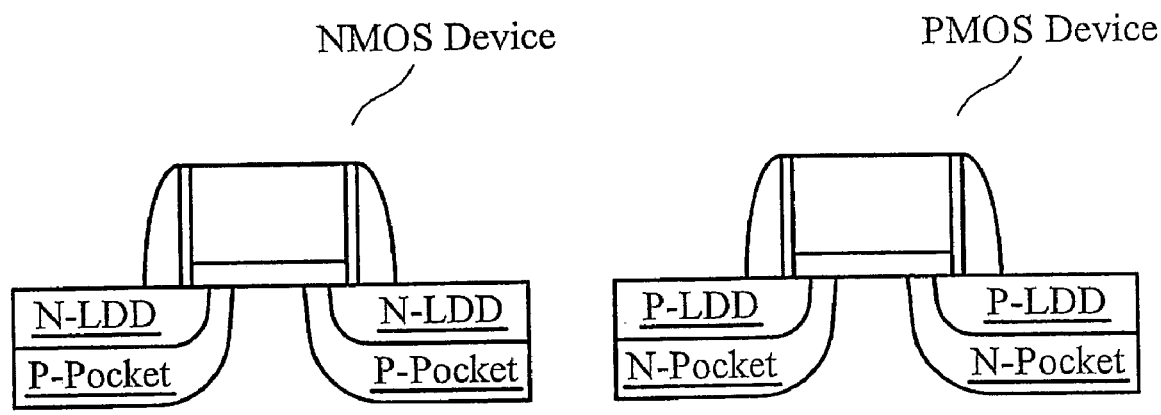
Figure 14:
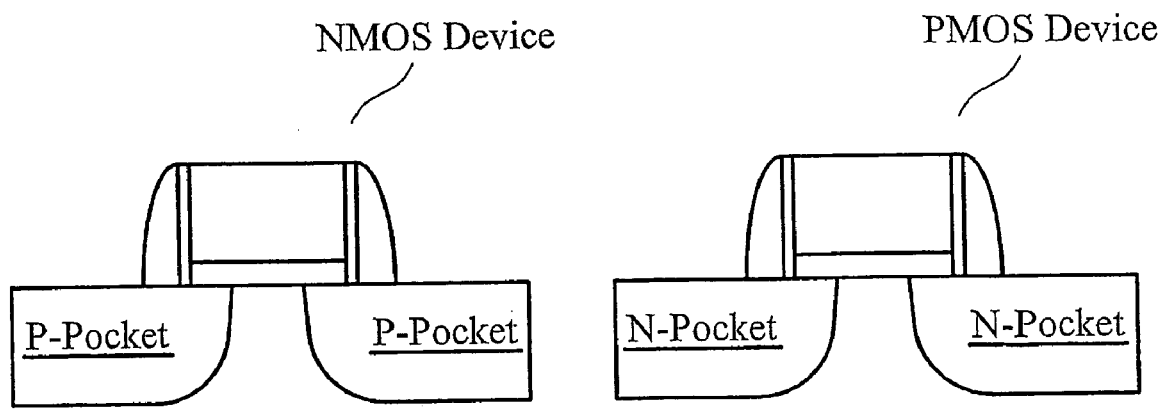
Figure 15:
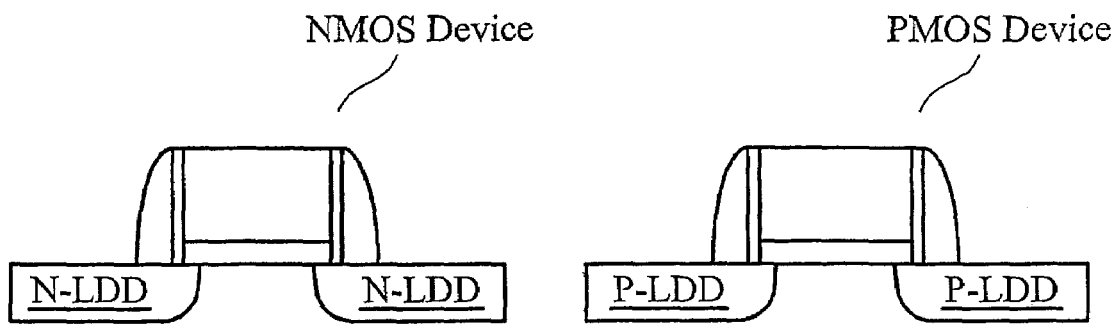

Preferably, MOS devices shown in FIG. 12 are digital devices, although analog devices having the same structure can be formed. Due to the decoupling of LDD regions and pocket regions, different combinations of LDD regions and pocket regions, as shown in FIGS. 13 through 15, can be formed. These structures are more suitable for analog MOS devices.

Figure 16:
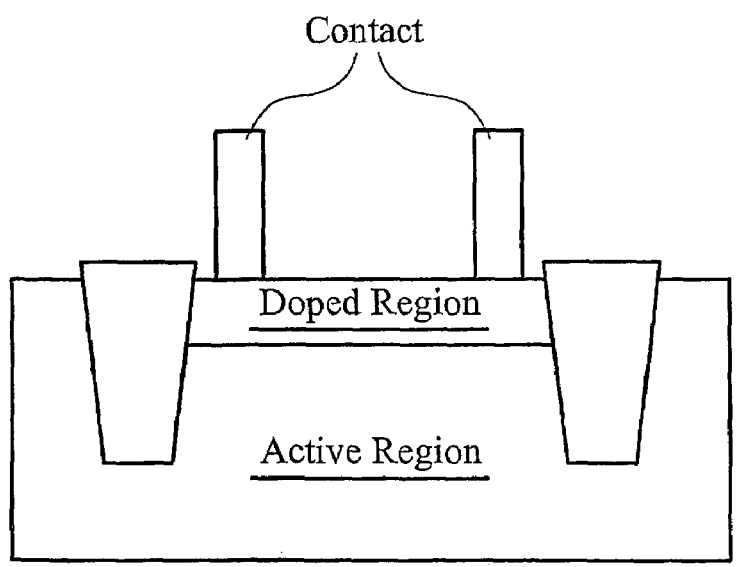
FIG. 16 illustrates a cross-sectional view of a resistor.

The preferred embodiments of the present invention can be used for the formation of resistors. Conventionally, resistors have been formed using the same process as used for forming LDD regions, except no gate electrodes and gate dielectrics are formed. However, since LDD regions and pocket regions were coupled, resistors comprise two types of impurities, making resistivity difficult to control. A preferred resistor is shown in FIG. 16, wherein the resistor includes a doped region formed in an active region. Contacts are formed connecting to the doped region. The doped region is preferably formed using either the N-LDD mask or the P-LDD mask. By using the preferred embodiments of the present invention, the resistors can have only one type of impurity. Resistivity is thus easier to control. The different combinations of LDD regions and pocket regions further increase the ability to adjust resistances. For example, the doped region may include an N-LDD region and a P-Pocket region for low-resistance.

The preferred embodiments of the present invention have several advantageous features. Firstly, LDD regions and pocket regions can have a same type. Without the presence of impurities of an opposite type, mismatch between analog MOS devices is reduced. Secondly, intrinsic gain of the analog MOS devices can be improved. Intrinsic gain can be expressed as $G_m*R_o$, wherein $G_m$ is transconductance and $R_o$ is output resistance. By removing pocket regions of an opposite type from the LDD regions, output resistance $R_o$ is increased, resulting in an increase in intrinsic gain.

Although analog MOS devices are typically formed in I/O device regions, they can be formed in core regions. Since transconductance $G_m$ can be increased by reducing the thickness of the gate oxide, the analog devices in core regions can achieve very high gain due to high transconductance $G_m$ and output resistance $R_o$.

Another advantageous feature of the preferred embodiments of the present invention is that by decoupling the formation of LDD regions and pocket regions, it is possible to customize the formation of MOS devices, particularly analog MOS devices, to suit customized design requirements. Such a customization, however, comes without the cost of additional masks. Additionally, there is no need to change formation steps of the integrated circuits.

A further advantageous feature is that better control of short channel core devices can be achieved by tuning the location of LDD regions. In addition, LDD regions and pocket regions having the same type are equivalent to deeper LDD regions. Device performance, therefore, can be increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
   providing a semiconductor chip including active regions;
   forming gate structures in the active regions;
   forming N-LDD regions on the semiconductor chip using an N-LDD mask;
   forming N-Pocket regions on the semiconductor chip using an N-Pocket mask, wherein the N-Pocket regions are of p-type, and wherein the N-LDD mask and the N-Pocket mask are different masks;
   forming P-LDD regions on the semiconductor chip using a P-LDD mask; and
   forming P-Pocket regions on the semiconductor chip using a P-Pocket mask, wherein the P-Pocket regions are of n-type, wherein the P-LDD mask and the P-Pocket mask are different masks, and wherein the N-LDD mask, the N-Pocket mask, the P-LDD mask, and the P-Pocket mask are for defining patterns in lithography processes.

2. The method of claim 1, wherein the N-LDD mask and the N-Pocket mask have different patterns.

3. The method of claim 1, wherein the P-LDD mask and the P-Pocket mask have different patterns.

4. The method of claim 1, wherein a photo resist formed using a mask selected from the group consisting essentially of the N-LDD mask, the P-LDD mask, the N-Pocket mask and the P-Pocket mask exposes active regions of all digital MOS devices and active regions of select analog MOS devices.

5. The method of claim 1 further comprising forming offset spacers on sidewalls of gate structures, wherein the step of forming the offset spacers is performed before the step of forming the N-LDD regions and the P-LDD regions and after the step of forming the N-Pocket regions and the P-Pocket regions.

6. The method of claim 1, wherein a photo resist formed using a mask selected from the group consisting of the N-LDD mask, the N-Pocket mask, the P-LDD mask and the P-Pocket mask comprises at least one pattern having an edge falling on a gate structure.

7. The method of claim 1 further comprising forming a resistor, wherein a pattern for the resistor is in only one of the N-LDD, P-LDD, N-Pocket and P-Pocket masks.

8. The method of claim 1 further comprising performing lithography processes for defining patterns of the N-LDD, N-Pocket, P-LDD and P-Pocket regions, wherein the N-LDD, N-Pocket, P-LDD, and P-Pocket masks are used in the lithography processes for defining the patterns.

9. The method of claim 1 further comprising:
   forming an N-LDD photo resist using the N-LDD mask;
   forming an N-Pocket photo resist using the N-Pocket mask;
   forming a P-LDD photo resist using the P-LDD mask; and
   forming a P-Pocket photo resist using the P-Pocket mask, wherein the N-LDD photo resist, the N-Pocket photo resist, the P-LDD photo resist, and the P-Pocket photo resist define patterns of the N-LDD, N-Pocket, P-LDD, and P-Pocket regions, respectively.

10. A method for forming a semiconductor structure, the method comprising:
    providing a semiconductor chip including active regions;
    forming a first photo resist on the semiconductor chip using an N-LDD mask, wherein the first photo resist exposes active regions of digital NMOS devices and select analog NMOS devices, and masks active regions of analog PMOS devices and digital PMOS devices;
    implanting an n-type impurity to form N-LDD regions;
    forming a second photo resist on the semiconductor chip using a P-LDD mask, wherein the second photo resist exposes active regions of digital PMOS devices and select analog PMOS devices, and masks active regions of analog NMOS devices and digital NMOS devices;
    implanting a p-type impurity to form P-LDD regions;
    forming a third photo resist on the semiconductor chip using an N-Pocket mask, wherein the third photo resist exposes active regions of digital NMOS devices and select analog PMOS devices, and masks active regions of analog NMOS devices and digital PMOS devices;
    implanting a p-type impurity to form N-Pocket regions;
    forming a fourth photo resist on the semiconductor chip using a P-Pocket mask, wherein the fourth photo resist exposes active regions of digital PMOS devices and select analog NMOS devices, and masks active regions of analog PMOS devices and digital NMOS devices; and
    implanting an n-type impurity to form P-Pocket regions.

11. The method of claim 10, wherein at least one of the first photo resist, the second photo resist, the third photo resist and the fourth photo resist exposes one of the source sides and drain sides of active regions of the select analog PMOS devices and the select NMOS devices and masks the other sides.

12. The method of claim 10 further comprising:
    forming gate electrodes in the active regions;
    forming offset spacers on sidewalls of the gate electrodes before the step of implanting the n-type impurity to form the N-LDD regions, and the step of implanting the p-type impurity to form the P-LDD regions; and wherein the step of forming the offset spacers is performed after the steps of implanting the p-type impurity to form the N-Pocket regions and implanting the n-type impurity to form the P-Pocket regions.

13. The method of claim 9, wherein no LDD region on the semiconductor chip is formed using the N-Pocket mask or the P-Pocket mask, and wherein no pocket region on the semiconductor chip is formed using the N-LDD mask or the P-LDD mask.

14. The method of claim 9 further comprising forming a resistor, wherein a pattern for the resistor is in only one of the N-LDD, P-LDD, N-Pocket and P-Pocket masks.

* * * * *

UNITED STATES PATENT AND TRADEMARK OFFICE
CERTIFICATE OF CORRECTION

PATENT NO. : 7,468,305 B2  Page 1 of 1
APPLICATION NO. : 11/414980
DATED : December 23, 2008
INVENTOR(S) : Yu et al.

It is certified that error appears in the above-identified patent and that said Letters Patent is hereby corrected as shown below:

In Col. 3, line 61, delete "usingthe" and insert --using the--.
In Col. 9, line 7, delete "9" and insert --10--.
In Col. 10, line 4, delete "9" and insert --10--.

Signed and Sealed this

Third Day of March, 2009

JOHN DOLL
*Acting Director of the United States Patent and Trademark Office*